(12) United States Patent
Yang et al.

(10) Patent No.: US 10,817,088 B2
(45) Date of Patent: Oct. 27, 2020

(54) DISPLAY DEVICE

(71) Applicant: Samsung Display Co., Ltd., Yongin-si (KR)

(72) Inventors: Sung-Jin Yang, Cheonan-si (KR); Hyunsik Park, Cheonan-si (KR); Taeik Kim, Asan-si (KR); Chungi You, Asan-si (KR); Sungho Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/738,632

(22) Filed: Jan. 9, 2020

(65) Prior Publication Data
US 2020/0225782 A1 Jul. 16, 2020

(30) Foreign Application Priority Data
Jan. 11, 2019 (KR) .................. 10-2019-0003812

(51) Int. Cl.
*G06F 3/041* (2006.01)
*H01L 27/32* (2006.01)

(52) U.S. Cl.
CPC ............ *G06F 3/041* (2013.01); *G06F 3/0412* (2013.01); *H01L 27/323* (2013.01)

(58) Field of Classification Search
CPC ........ G06F 3/041; G06F 3/0412; G06F 3/044; G06F 3/045; G06F 3/047; G06F 3/046; H01L 27/323
See application file for complete search history.

(56) References Cited

U.S. PATENT DOCUMENTS

| 8,648,824 | B2 | 2/2014 | Lee |
| 9,323,372 | B2 | 4/2016 | Kim et al. |
| 2011/0018826 | A1* | 1/2011 | Shoji ................. G06F 3/044 345/173 |
| 2011/0057893 | A1 | 3/2011 | Kim et al. |
| 2011/0141042 | A1* | 6/2011 | Kim .................. G06F 3/0412 345/173 |

(Continued)

FOREIGN PATENT DOCUMENTS

| KR | 10-1082162 | 11/2011 |
| KR | 10-1082293 | 6/2017 |

(Continued)

*Primary Examiner* — Dmitriy Bolotin
(74) *Attorney, Agent, or Firm* — H.C. Park & Associates, PLC

(57) ABSTRACT

A display device including a first substrate, a second substrate, sensing electrodes disposed on the second substrate and to sense an input, sensing wirings electrically connected to the sensing electrodes, an input sensing panel including sensing pads electrically connected to the sensing wirings, and a coupling member to couple the first substrate and the second substrate, wherein the sensing wirings respectively include transparent conductive wirings disposed on the second substrate and metal wirings disposed on the transparent conductive wirings and electrically connected to the transparent conductive wirings, and each of the sensing pad includes a transparent conductive pad disposed on the second substrate and connected to the transparent conductive wiring.

20 Claims, 14 Drawing Sheets

(56) References Cited

U.S. PATENT DOCUMENTS

| | | | |
|---|---|---|---|
| 2011/0193799 A1* | 8/2011 | Jun | G06F 3/0446 |
| | | | 345/173 |
| 2017/0068368 A1* | 3/2017 | Hsiao | G06F 3/044 |
| 2017/0123253 A1* | 5/2017 | Sugita | G02F 1/13338 |
| 2018/0267353 A1* | 9/2018 | Takeda | G02F 1/1343 |
| 2020/0167054 A1 | 5/2020 | You et al. | |
| 2020/0225782 A1* | 7/2020 | Yang | G06F 3/041 |

FOREIGN PATENT DOCUMENTS

| | | |
|---|---|---|
| KR | 10-1744784 | 6/2017 |
| KR | 10-2020-0061444 | 6/2020 |

* cited by examiner

DISPLAY DEVICE

CROSS-REFERENCE TO RELATED APPLICATION

This application claims priority from and the benefit of Korean Patent Application No. 10-2019-0003812, filed on Jan. 11, 2019, which is hereby incorporated by reference for all purposes as if fully set forth herein.

BACKGROUND

Field

The invention relates to a display device, and more particularly, to a display device having improved durability.

Discussion of the Background

A display device may include a display panel on which an image is displayed and an input sensing panel that senses an external input. The input sensing panel may be provided as an integrated type with the display panel through consecutive processes. Alternatively, the input sensing panel may be provided through a separate process from the display panel, and then combined to the display panel. When the combination of the input sensing panel to the display panel is not stable, a foreign material or moisture may permeate between the input sensing panel and the display panel to lower reliability.

The above information disclosed in this Background section is only for understanding of the background of the inventive concepts, and, therefore, it may contain information that does not constitute prior art.

SUMMARY

Applicant discovered that the metal wiring that forms the sensing lines in an input sensing panel may block light used to cure a coupling member connecting the input sensing panel to the display panel, thereby reducing the integrity of the connection. The invention uses a combination of metal and transparent conductive wiring to produce a double wiring structure that improves the connection between the input sensing panel and the display panel, as well as the overall durability of the resulting display device.

Exemplary implementations of the invention improve durability of the sensing wiring through the double sensing wiring structure, and the durability of the coupling member area connecting the input sensing panel and the display panel.

Additional features of the inventive concepts will be set forth in the description which follows, and in part will be apparent from the description, or may be learned by practice of the inventive concepts.

According to an exemplary embodiment of the invention, a display device includes: a display panel including a first substrate, a display circuit layer disposed on the first substrate, and an image implementation layer disposed on the display circuit layer, an input sensing panel including a second substrate disposed on the display panel, sensing electrodes disposed on the second substrate and configured to sense an input, sensing wirings electrically connected with the sensing electrodes, and sensing pads electrically connected to the sensing wirings, and a coupling member to connect the first substrate and the second substrate. At least some of the sensing wirings include a transparent conductive wiring disposed on the second substrate, and a metal wiring disposed on the transparent conductive wiring and electrically connected to the transparent conductive wiring. At least some of the sensing pads include a transparent conductive pad disposed on the second substrate and connected to the transparent conductive wiring. And, the metal wiring may be extended to a region adjacent to a coupling region in which the coupling member is disposed.

The metal wiring may not overlap the coupling region.

Each of the sensing pads may be defined with a coupling pad region configured to overlap the coupling region and a surrounding pad region configured not to overlap the coupling region, and, the surrounding pad region may be defined between the coupling pad region and the metal wiring.

At least some of the sensing pads may further include a metal pad disposed on the transparent conductive pad and extending from the metal wiring, and the metal pad may overlap the surrounding pad region and may not overlap the coupling pad region.

The input sensing panel may further include an insulation layer disposed between the transparent conductive pad and the metal pad, the transparent conductive pad and the metal pad may be electrically connected to each other through at least one contact hole defined in the insulation layer, and the at least one contact hole may be defined in a region overlapping the surrounding pad region.

An area of the transparent conductive pad may include a first surface area, and the metal pad may include a second surface area smaller than the first surface area.

The input sensing panel may further include a first insulation layer disposed between a portion of the transparent conductive wiring and a portion of the metal wiring, and a second insulation layer disposed on the first insulation layer and covering the metal wiring.

The first insulation layer and the second insulation layer may cover at least a part of the transparent conductive pad.

An opening may be defined in the first insulation layer and the second insulation layer, and the opening may completely expose the transparent conductive pad.

An end of the first insulation layer and an end of the second insulation layer may be separated from the transparent conductive pad.

At least some of the sensing pads may further include a first metal pad disposed on the transparent conductive pad and a second metal pad disposed on the transparent conductive pad, the first metal pad may be extended from the metal wiring, and the second metal pad may be separated from the first metal pad with the coupling region disposed therebetween.

In an exemplary embodiment, each of the at least some sensing wirings has a first width and each of the at least some sensing pads has a second width larger than the first width.

The sensing electrodes may include a first sensing electrode including first sensing patterns and first connection patterns, and a second sensing electrode including second sensing patterns and second connection patterns, the first sensing patterns, the second sensing patterns, and the first connection patterns may be disposed on the second substrate, and the second connection patterns may be insulated from the first connection patterns and the first sensing patterns and disposed on the first connection patterns.

The first sensing patterns, the second sensing patterns, and the first connection patterns may include a material the same as a material of the transparent conductive wiring and the transparent conductive pad, and the second connection patterns may include a material to the same as a material of the metal wiring.

In an exemplary embodiment, the coupling member may surround the sensing electrodes and the sensing wirings, and overlap at least a part of each of the at least some sensing pads.

According to another exemplary embodiment of the invention, a display device includes: a first substrate, a second substrate disposed on the first substrate, and in which an active region and a non-active region configured to surround the active region are defined, a coupling member disposed between the first substrate and the second substrate, and to couple the first substrate and the second substrate, sensing electrodes disposed on the active region of the second substrate, sensing wirings disposed on the non-active region of the second substrate, respectively electrically connected to the sensing electrodes, wherein each of the sensing pads comprises a transparent conductive wiring and a metal wiring disposed on the transparent conductive wiring, and sensing pads disposed on the non-active region of the second substrate, wherein at least some of the sensing pads comprises a transparent conductive pad extended from the transparent conductive wiring and disposed on an identical layer to the transparent conductive wiring, wherein the coupling member overlaps the sensing pads.

In an exemplary embodiment, the coupling member might overlap the non-active region, and may not overlap the sensing wirings.

The transparent conductive wiring may include indium tin oxide, and the metal wiring may include molybdenum.

Each of the sensing pads may further include a metal pad disposed on the transparent conductive pad and extended from the metal wiring, and, the metal pad may not overlap the coupling member.

The transparent conductive pad has a first surface area and the metal pad has a second.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
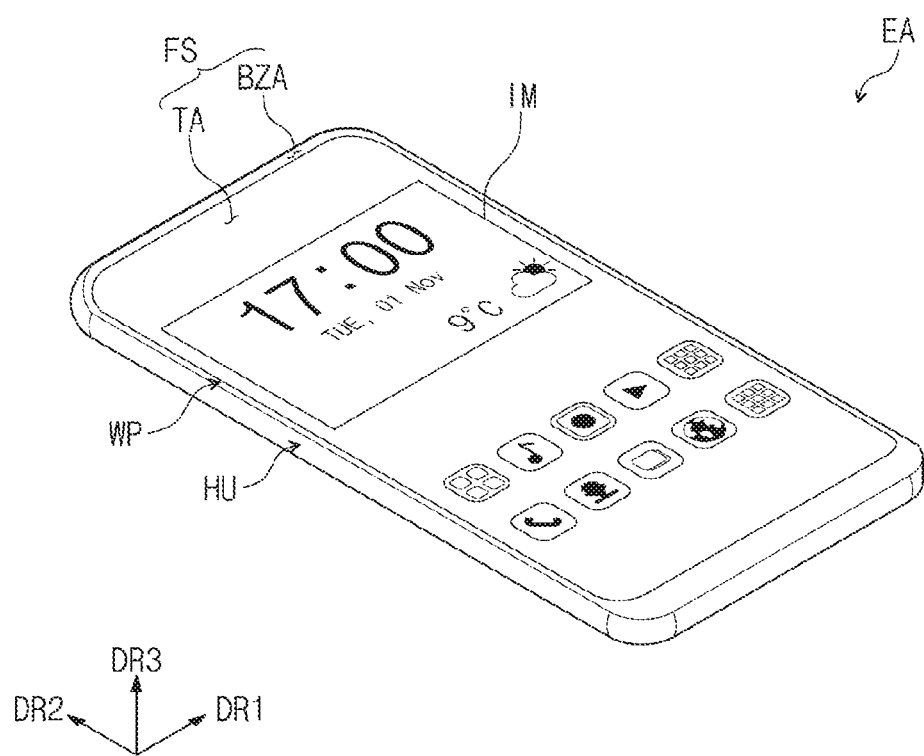
FIG. 1 is a perspective view of a display device constructed according to an exemplary embodiment of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
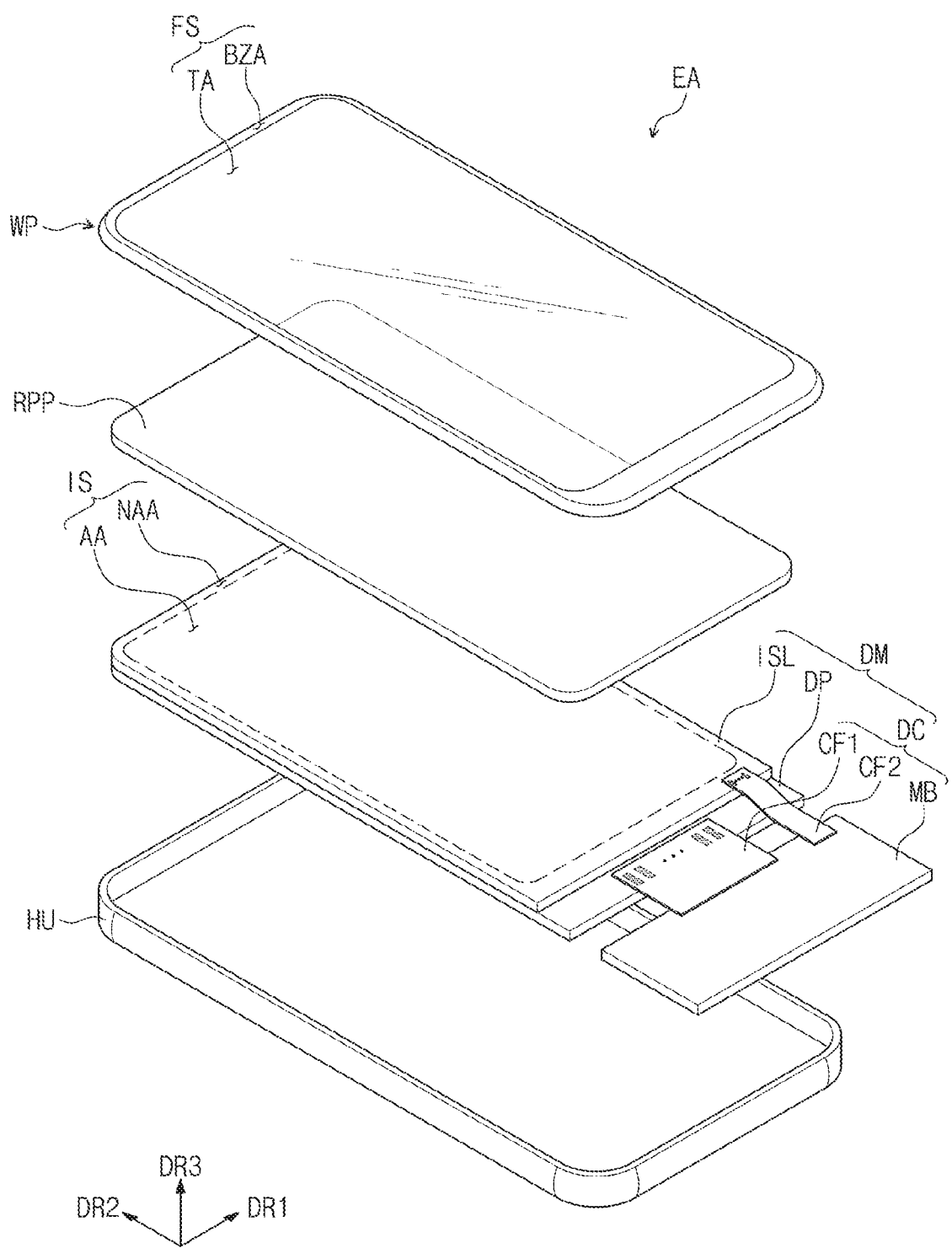
FIG. 2 is an exploded perspective view of a display device constructed according to an exemplary embodiment of the invention.

FIG. 1 is a perspective view of a display device according to an embodiment of the invention. FIG. 2 is an exploded perspective view of a display device according to an embodiment of the invention.

In relation to FIGS. 1 and 2, the display device EA may be a device activated according to an electrical signal. The display device EA may be implemented according to various exemplary embodiments. For example, the display device EA may be used in a large electronic device such as a television, a monitor, or an external billboard, or also used in a small and medium electronic device such as a personal computer, a notebook computer, a personal digital terminal, a car navigation unit, a game console, a portable electronic device, or a camera. In addition, these examples are presented only as exemplary embodiments, and the display device EA may also be employed in or as other electronic devices without deviating from the inventive concepts. In the illustrated exemplary embodiments, the display device EA is exemplarily shown as a smartphone.

The display device EA may display an image IM on a display surface FS extending in a plane parallel to a first direction DR1 and a second direction DR2 having a thickness in a third direction DR3. The image IM may include a still image as well as a moving image. In FIG. 1, as an example of the image IM, a clock window and icons are illustrated. The display surface FS on which the image IM is displayed may correspond to the front surface of the display device EA and to the front surface of the window layer WP.

In the illustrated exemplary embodiment, on the basis of a direction in which the image IM is displayed, a front surface (or an upper surface) of each member and a rear surface (or a lower surface) of each member are defined. The front surface and the rear surface face each other in the third direction DR3, and the normal direction of the front surface and the rear surface may be parallel to the third direction DR3. On the other hand, directions indicated by the first to third directions DR1, DR3, and DR3 are relative concepts to each other and may be changed to other directions. Hereinafter, the first to third directions are respectively indicated by the first to third directions DR1, DR2, and DR3 and refer to the same reference numerals. The expression "when viewed in plan" means when viewed from the third direction DR3.

The display device EA according to an exemplary embodiment of the invention may sense a user input applied externally. The user input includes various types of external inputs such as a part of the user's body, light, heat, or pressure. In addition, the display device EA may sense a user input applied to a side surface or the rear surface of the display device EA according to the structure of the display device EA, but is not limited to any one particular embodiment.

The display device EA may include a window panel WP, an anti-reflection panel (RPP), a display module DM and a housing HU. In the illustrated exemplary embodiment, the window panel WP and the housing HU may be combined to provide the appearance of the display device EA.

The window panel WP may include an optically transparent insulation material. For example, the window panel WP may include glass or plastic. The window panel WP may have a multilayer structure or a single layer structure. For example, the window panel WP may include a plurality of plastic films bonded by an adhesive or a glass substrate and a plastic film bonded by an adhesive.

The front surface FS of the window panel WP defines the front surface of the display device EA, as described above. A transmission region TA may be an optically transparent region. For example, the transmission region TA may have a region in which optical transmittance is about 90% or more.

A bezel region BZA may have a relatively low optical transmittance in comparison to the transmission region TA. The bezel region BZA may define the shape of the transmission region TA. The bezel region BZA may be adjacent to the transmission region TA, and surround the transmission region TA.

The bezel region BZA may have a prescribed color. The bezel region BZA may cover a non-active region NAA of the display module 200 to block the non-active region NAA from being visibly recognized. On the other hand, these are exemplarily illustrated, and the bezel region BZA may be omitted in the window panel WP according to an exemplary embodiment of the invention.

The anti-reflection panel RPP may be disposed under the window panel WP. The anti-reflection panel RPP reduces a reflection ratio of external light incident from an upper side of the window panel WP. In an exemplary embodiment of the invention, the anti-reflection panel RPP may be omitted, or included in the display module DM.

The display module DM may display the image IM and sense an external input. The display module DM includes the front surface IS that includes an active region AA and the non-active region NAA. The active region AA may be an area activated according to an electrical signal.

In the illustrated exemplary embodiment, the active region AA may be a region on which the image IM is displayed, and the external input is sensed. The transmission region TA overlaps at least the active region AA. For example, the transmission region TA overlaps the entire surface of or at least a part of the active region AA. Accordingly, a user may visibly recognize the image IM or provide the external input through the transmission region TA. However, the above-described is exemplarily described, and the active region AA may be divided into a region on which the image IM is displayed and a region on which the external input is sensed. The inventive concepts are not limited to any one particular embodiment.

The non-active region NAA may be covered by the bezel region BZA. The non-active region NAA is adjacent to the active region AA. The non-active region NAA may surround the active region AA. In the non-active region NAA, a driving circuit, driving lines or the like for driving the active region AA may be disposed.

The display module DM includes a display panel DP, an input sensing panel ISL, and a driving circuit DC.

The display panel DP may be a component configured to substantially generate the image IM. The image IM generated by the display panel DP is visibly recognized by the user from the outside through the transmission region TA.

The input sensing panel ISL senses an input applied from the outside. As described above, the input sensing panel ISL may sense an external input provided to the window panel WP.

The driving circuit DC may be electrically connected to the display panel DP and the input sensing panel ISL. The driving circuit DC may include a main circuit board MB, a first circuit board CF1, and a second circuit board CF2.

The first circuit board CF1 is electrically connected to the display panel DP. The first circuit board CF1 may connect the display panel DP to the main circuit board MB. In the illustrated exemplary embodiment, the first circuit board CF1 is illustrated as a flexible circuit film. However, this is exemplarily illustrated, and the first circuit board CF1 may not be connected to the main circuit board MB, and may be a rigid board.

The first circuit board CF1 may be connected to pads (display pads) of the display panel DP disposed in the non-active region NAA. The first circuit board CF1 provides an electrical signal for driving the display panel DP to the display panel 210. The electrical signal may be generated by the first circuit board CF1 or the main circuit board MB.

The second circuit board CF2 is electrically connected to the input sensing panel ISL. The second circuit board CF2 may connect the input sensing panel ISL to the main circuit board MB. In the illustrated exemplary embodiment, the second circuit board CF2 is illustrated as a flexible circuit film. However, this is exemplarily illustrated, and the second circuit board CF2 may not be connected to the main circuit board MB, and may be a rigid board.

The second circuit board CF2 may be connected to pads (sensing pads) of the input sensing panel ISL disposed in the non-active region NAA. The second circuit board CF2 provide an electrical signal for driving the input sensing panel ISL to the input sensing panel ISL. The electrical signal may be generated by the second circuit board CF2 or the main circuit board MB.

The main circuit board MB may include various types of driving circuits for driving the display module DM, or a connector for supplying power, or the like. Each of the first circuit board CF1 and the second circuit board CF2 may be connected to the main circuit board MB. According to an exemplary embodiment of the invention, the display module 200 may be easily controlled using one main circuit board MB. However, this is only exemplary, and in the display module DM according to an exemplary embodiment of the invention, the display panel DP and the input sensing panel ISL may be connected to different main circuit boards, or any one of the first circuit board CF1 and the second circuit board CF2 may not be connected to the main circuit board MB, and thus the exemplary embodiment of the invention is not limited to any one particular embodiment.

The housing HU is combined to the window panel WP. The housing HU is combined to the window panel WP to provide a prescribed internal space. The display module DM may be accommodated in the internal space.

The housing HU may include a material having relatively high hardness. For example, the housing HU may include a plurality of frames and/or plates including glass, plastic, metal, or a combination thereof. The housing HU may stably protect components of the display device EA accommodated in the internal space from an external shock.

Figure 3:
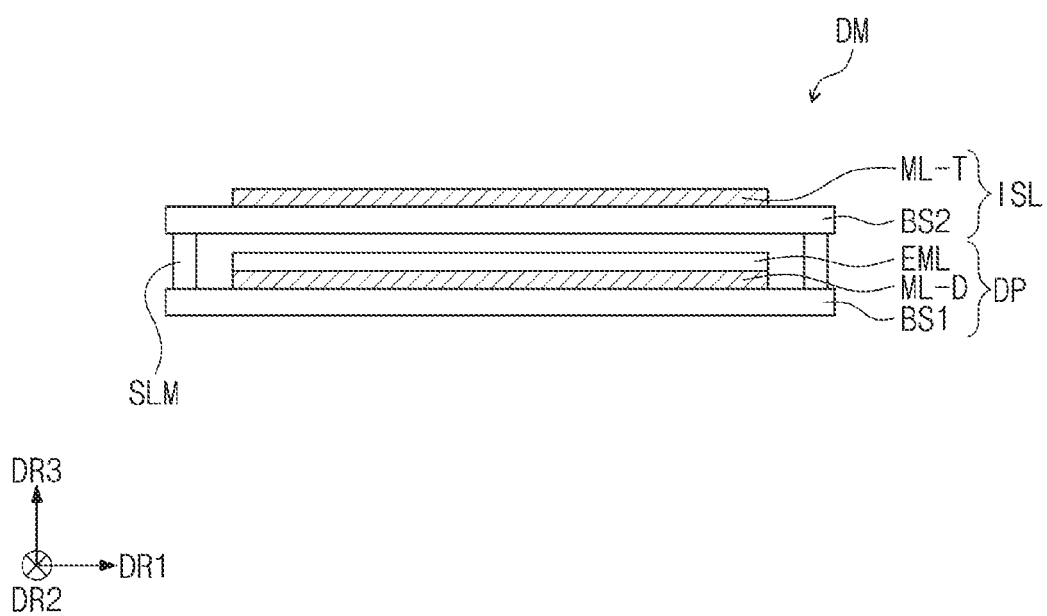
FIG. 3 is a cross-sectional view of a display device constructed according to an exemplary embodiment of the invention.

FIG. 3 is a cross-sectional view of a display device according to an exemplary embodiment of the invention.

In relation to FIG. 3, the display module DM may include the display panel DP, the input sensing panel ISL, and a coupling member SLM.

The display panel DP according to an exemplary embodiment of the invention may be an emissive display panel, but is not particularly limited. For example, the display panel DP may be an organic light emitting display panel or a quantum dot light emitting display panel or other type of display panel known in the art.

The display panel DP may include a first substrate BS1, a display circuit layer ML-D, and an image implementation layer EML. The input sensing panel ISL may include a second substrate BS2 and a sensing circuit layer ML-T.

Each of the first substrate BS1 and the second substrate BS2 may be a laminate structure including a silicon substrate, a plastic substrate, a glass substrate, an insulation film, or a plurality of insulation layers.

The display circuit layer ML-D may be disposed on the first substrate BS1. The display circuit layer ML-D may include a plurality of insulation layers, a plurality of conductive layers, and a semiconductor layer. The plurality of conductive layers of the display circuit layer ML-D may provide signal wirings or a control circuit for pixels.

The image implementation layer EML may be disposed on the display circuit layer ML-D. The image implementation layer EML may be a layer configured to emit light or control the transmissivity of light. For example, the image implementation layer EML of the organic light emitting display panel may include an organic light emitting material. The image implementation layer EML of the quantum dot light emitting display panel may include at least any one of a quantum dot or a quantum rod. The image implementation layer EML of a liquid crystal display panel may include a liquid crystal layer.

The second substrate BS2 may be disposed on the image implementation layer EML. A prescribed space may be defined between the second substrate BS2 and the image implementation layer EML. The space may be filled with air or an inert gas. In addition, in an exemplary embodiment of the invention, the space may be filled with a filler material such as silicone polymer, an epoxy resin, an acrylic resin, or the like.

The sensing circuit layer ML-T may be disposed on the second substrate BS2. The sensing circuit layer ML-T may include a plurality of insulation layers and a plurality of conductive layers. The plurality of conductive layers may provide a sensing electrode configured to sense an external input, a sensing wiring connected to the sensing electrode, and a sensing pad connected to the sensing wiring. More specific descriptions of these components will be provided herein.

The coupling member SLM may be disposed between the first substrate BS1 and the second substrate BS2. The coupling member SLM may couple the first substrate BS1 and the second substrate BS2. The coupling member SLM may include an organic material such as a photo-curable resin or a photo-plastic resin, or an inorganic material such as a frit seal, but is not limited to any one particular embodiment.

The coupling member SLM may be any type of connector that couples the first substrate BS1 and the second substrate BS2 together. For example, the connector may take the form of the coupling member SLM material such as an organic material such as a photo-curable resin or a photo-plastic resin, or an inorganic material such as a frit seal, but is not limited to any one particular embodiment.

Figure 4A:
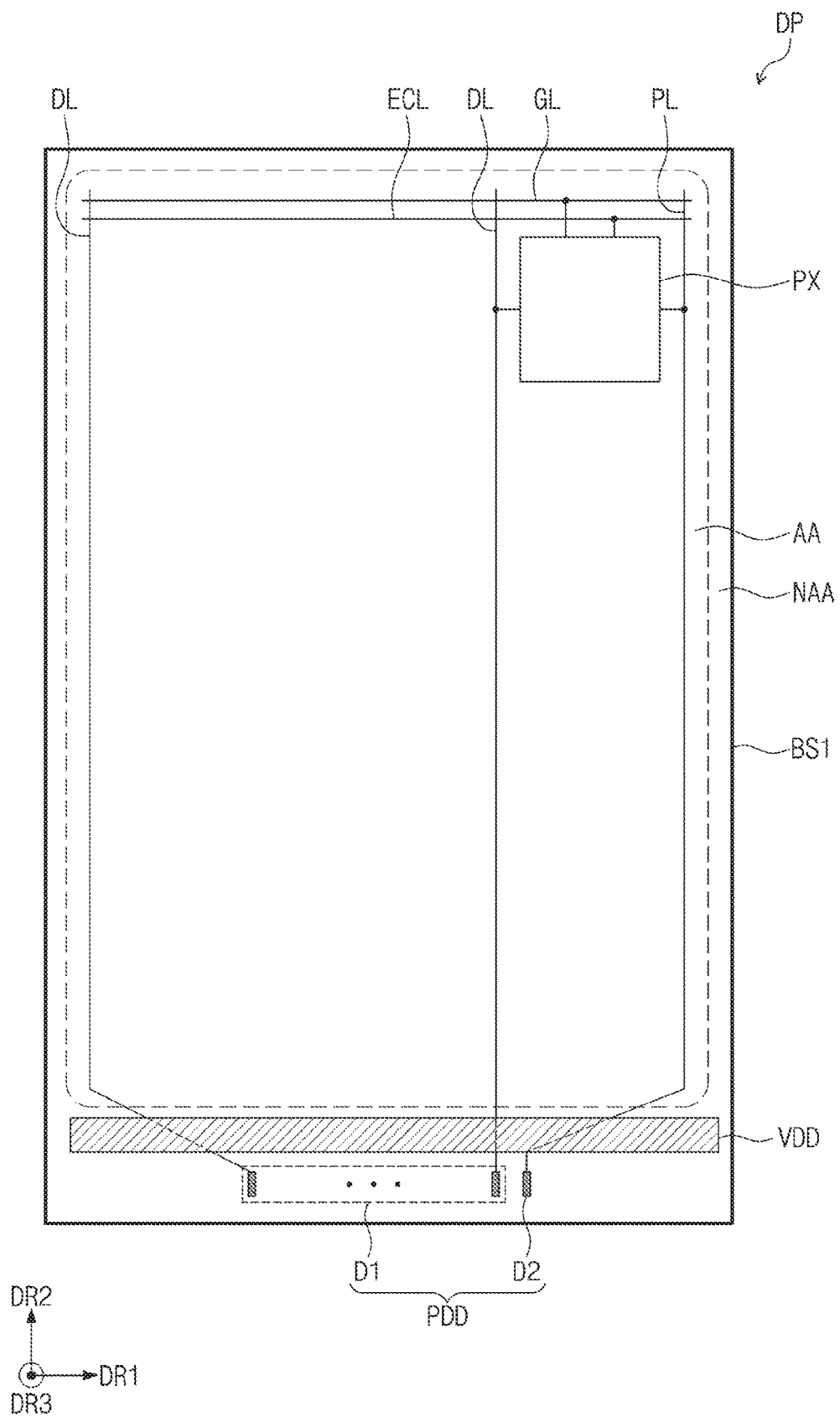
FIG. 4A is a plan view of a display panel constructed according to an exemplary embodiment of the invention.
Figure 4B:
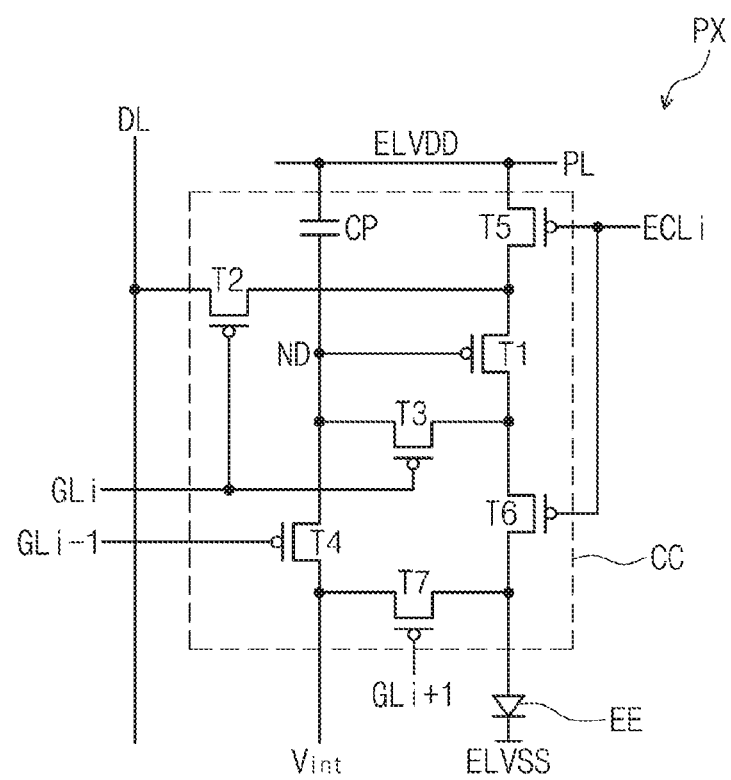
FIG. 4B is an equivalent circuit diagram of a representative pixel constructed according to an exemplary embodiment of the invention.

FIG. 4A is a plan view of a display panel according to an exemplary embodiment of the invention. FIG. 4B is an equivalent circuit diagram of a pixel according to an exemplary embodiment of the invention.

In relation to FIG. 4A, the display panel DP may include a plurality of pixels PX, a plurality of signal lines GL, DL, PL, and ECL, and a plurality of display pads PDD.

An active region AA of the display panel DP is a region on which an image is displayed, and a non-active region NAA may be a region in which a driving circuit, a driving wiring, or the like is disposed. In FIG. 4A, the active region AA and the non-active region NAA of the display panel DP are illustrated. A plurality of pixels PX may be disposed in the active region AA.

The plurality of signal lines GL, DL, PL, and ECL are connected to the pixels PX to transfer electrical signals to the pixels PX. One pixel PX among the plurality of pixels PX is exemplarily illustrated in FIG. 4A. Among the signal lines included in the display panel DP, a scan line GL, a data line DL, a power line PL, and an emission control line ECL are exemplarily illustrated. However, these are exemplary, and the signal lines GL, DL, PL, and ECL may further include an initialization voltage line. The exemplary embodiment of the invention is not limited to any one particular embodiment.

In relation to FIG. 4B, a signal circuit diagram of one pixel PX among the plurality of pixels is exemplarily enlarged and illustrated. In FIG. 4B, the pixel PX is exemplarily illustrated which is connected to an ith scan line GLi and an ith emission control line ECLi.

The pixel PX may include a light emitting element EE and a pixel circuit CC.

The pixel circuit CC may include a plurality of transistors T1 to T7 and a capacitor CP. The plurality of transistors T1 to T7 may be provided through a Low Temperature Polycrystalline Silicon (LTPS) or a Low Temperature Polycrystalline Oxide (LTPO) process.

The pixel circuit CC controls a current amount flowing through the light emitting element EE in correspondence to a data signal. The light emitting element EE may emit light with a prescribed luminance in correspondence to the current amount provided from the pixel circuit CC. To this end, the level of a first power supply ELVDD may be set higher than that of a second power supply ELVSS. The light emitting element EE may include an organic light emitting element or a quantum dot light emitting element.

Each of the plurality of transistors T1 to T7 may include an input electrode (or a source electrode), an output electrode (or a drain electrode), and a control electrode (or a gate electrode). For convenience, any one of the input electrode and the output electrode may be referred to as a first electrode, and the other may be referred to as a second electrode herein The first electrode of the first transistor T1 is connected to the first power supply ELVDD via the fifth transistor T5, and the second electrode of the first transistor T1 is connected to the anode electrode of the light emitting element EE via the sixth transistor T6. The first transistor T1 may be referred to as a driving transistor.

The first transistor T1 controls a current amount flowing through the light emitting element EE in correspondence to a voltage applied to the control electrode of the first transistor T1.

The second transistor T2 is connected between the data line DL and the first electrode of the first transistor T1. In addition, the control electrode of the second transistor T2 is connected to the ith scan line GLi. When an ith scan signal is provided to the ith scan line GLi, the second transistor T2 is turned on to electrically connect the data line DL to the first electrode of the first transistor T1.

The third transistor T3 is connected between the second electrode of the first transistor T1 and the control electrode of the first transistor T1. The control electrode of the third transistor T3 is connected to the ith scan line GLi. When the ith scan signal is provided to the ith scan line GLi, the third transistor T3 is turned on to electrically connect the second electrode of the first transistor T1 to the control electrode of the first transistor T1. Accordingly, when the third transistor T3 is turned on, the first transistor is diode-connected.

The fourth transistor T4 is connected between a node ND and an initialization power generation unit. In addition, the control electrode of the fourth transistor T4 is connected to an (i−1)th scan line GLi−1. When an (i−1)th scan signal is provided to the (i−1)th scan line GLi−1, the fourth transistor T4 is turned on to provide an initialization voltage Vint to the node ND.

The fifth transistor T5 is connected between the power line PL and the first electrode of the first transistor T1. The control electrode of the fifth transistor T5 is connected to the ith emission control line ECLi.

The sixth transistor T6 is connected between the second electrode of the first transistor T1 and the anode electrode of the light emitting element EE. In addition, the control electrode of the sixth transistor T6 is connected to the ith emission control line ECLi.

The seventh transistor T7 is connected between the initialization power generation unit and the anode electrode of the light emitting element EE. In addition, the control electrode of the seventh transistor T7 is connected to the (i+1)th scan line GLi+1. When an (i+1)th scan line is provided to an (i+1)th scan line GLi+1, the seventh transistor T7 is turned on to provide the initialization voltage Vint to the anode electrode of the light emitting element EE.

The seventh transistor T7 may improve black representation capability of the pixel PX. In detail, when the seventh transistor T7 is turned on, a parasite capacitor of the light emitting element EE is discharged. Then, at the time of implementing black luminance, the light emitting element EE does not emit light due to a leakage current from the first transistor T1, and accordingly, the black representation capability may be improved.

Additionally, in FIG. 4B, the control electrode of the seventh transistor T7 is illustrated to be connected to the (i+1)th scan line GLi+1, but the exemplary embodiments of the invention are not limited thereto. In another exemplary embodiment of the invention, the control electrode of the seventh transistor T7 may be connected to the ith scan line GLi or the (i−1)th scan line GLi−1.

A capacitor CP is disposed between the power line PL and the node ND. The capacitor CP stores a voltage corresponding to a data signal. When the fifth transistor T5 and the sixth transistor T6 are turned on according to the voltage stored in the capacitor CP, the current amount flowing through the first transistor T1 may be determined.

The equivalent circuit of the representative pixel PX in an exemplary embodiment of the invention is not limited to that illustrated in FIG. 4B. In another exemplary embodiment of the invention, the pixel PX may be implemented in various types in order to cause the light emitting element EE to emit light. In FIG. 4B, the pixel PX is illustrated on the basis of a PMOS, but is not limited thereto. In another exemplary embodiment of the invention, the pixel circuit CC may be provided with an NMOS. In another exemplary embodiment of the invention, the pixel circuit CC may be provided with a combination of the NMOS and PMOS.

Referring to FIG. 4A again, a power pattern VDD is disposed in the non-active region NAA. In the illustrated exemplary embodiment, the power pattern VDD is connected to the plurality of power lines PL. Accordingly, the display panel DP may include the power pattern VDD to provide an identical first power signal to the plurality of pixels.

The display pads PDD may include a first pad D1 and a second pad D2. The first pad D1 may be provided in plurality to be respectively connected to the data lines DL. The second pad D2 may be connected to the power pattern VDD to be electrically connected to the power line PL. The display panel DP may provide, to the pixels PX, electrical signals externally provided through the display pads PDD. On the other hand, the display pads PDD may further include pads configured to receive other electrical signals besides the first pad D1 and the second pad D2, but are not limited to any particular embodiment.

Figure 5:
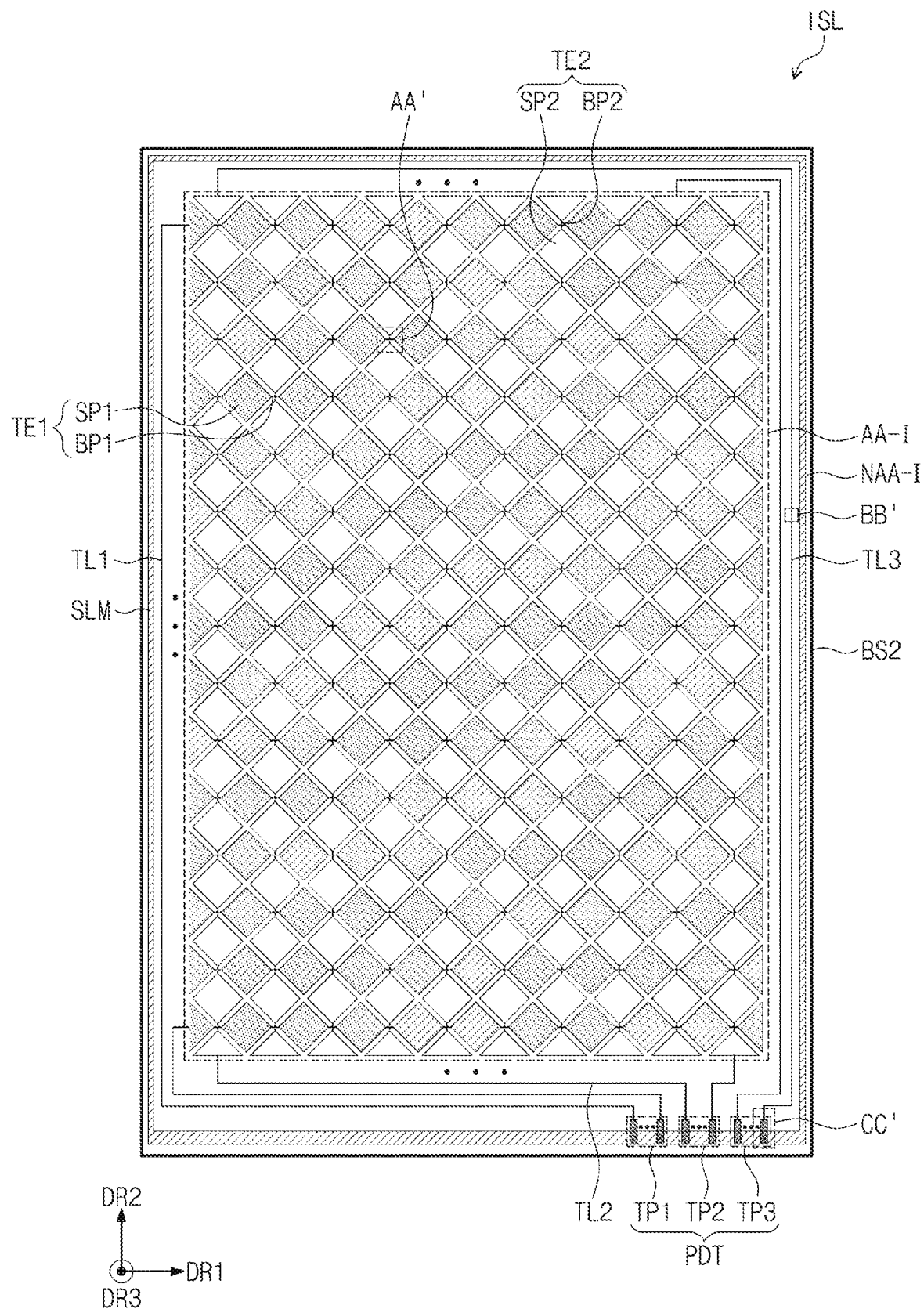
FIG. 5 is a plan view of an input sensing panel constructed according to an exemplary embodiment of the invention.

FIG. 5 is a plan view of an input sensing panel according to an exemplary embodiment of the invention.

In relation to FIG. 5, the input sensing panel ISL includes the second substrate BS2, a first sensing electrode TE1, a second sensing electrode TE2, a plurality of sensing wirings TL1, TL2 and TL3, and a plurality of sensing pads PDT. The first sensing electrode TE1, the second sensing electrode TE2, the plurality of sensing wirings TL1, TL2, and TL3, and the plurality of sensing pads PDT may constitute the sensing circuit layer ML-T (see FIG. 3).

An active region AA-I and a non-active region NAA-I may be defined in the second substrate BS2. The non-active region NAA-I may surround the active region AA-I. The first sensing electrode TE1 and the second sensing electrode TE2 may be disposed on the active region AA-I. The input sensing panel ISL may obtain information on an external input through a change in capacitance between the first sensing electrode TE1 and the second sensing electrode TE2.

The first sensing electrode TE1 may include first sensing patterns SP1 and first connection patterns BP1. At least one first connection pattern BP1 may be connected to two adjacent first sensing patterns SP1. The second sensing electrode TE2 may include second sensing patterns SP2 and second connection patterns BP2. At least one second connection pattern BP2 may be connected to two adjacent second sensing patterns SP2.

The sensing wirings TL1, TL2, and TL3 are disposed in the non-active region NAA-I. The sensing wirings TL1, TL2, and TL3 may include a first sensing wiring TL1, a second sensing wiring TL2, and a third sensing wiring TL3.

The first sensing line TL1 is connected to the first sensing electrode TE1. The second sensing line TL2 is connected to one end of the second sensing electrode TE2. The third sensing line TL3 is connected to the other end of the second sensing electrode TE2. The other end of the second electrode TE2 may be a part facing and spaced away from the one end of the second sensing electrode TE2.

According to an exemplary embodiment of the invention, the second sensing electrode TE2 may be connected to the second sensing line TL2 and the third sensing line TL3. Accordingly, sensitivity over a region may be uniformly maintained with respect to the second sensing electrode TE2 having a longer length than the first sensing electrode TE1.

However, this is only exemplary, and the third line TL3 may be omitted. The invention is not limited to any one particular embodiment.

The sensing pads PDT are disposed in the non-active area NAA-I. The sensing pads PDT may include a first sensing pad TP1, a second sensing pad TP2, and a third sensing pad TP3. The first sensing pad TP1 is connected to the first sensing wiring TL1 to be electrically connected to the first sensing electrode TE1. The second sensing pad TP2 is connected to the second sensing wiring TL2, and the third sensing pad TP3 is connected to the third sensing wiring TL3. Accordingly, the second sensing pad TP2 and the third sensing pad TP3 are electrically connected to the second sensing electrode TE2.

The first width of the first sensing wiring TL1 may be smaller than the second width of the first sensing pad TP1, the first width of the second sensing wiring TL2 may be smaller than the second width of the second sensing pad TP2, and the first width WT1 (see FIG. 10) of the third sensing wiring TL3 may be smaller than the second width WT2 (see FIG. 10) of the third sensing pad TP3.

FIG. 5 illustrates the coupling member SLM disposed under the input sensing panel ISL. In a plan view, the coupling member SLM may overlap the non-active region NAA-I, and surround the active region AA-I. The coupling member SLM may not overlap the sensing wirings TL1, TL2, and TL3, but may overlap the sensing pads PDT.

Figure 6:
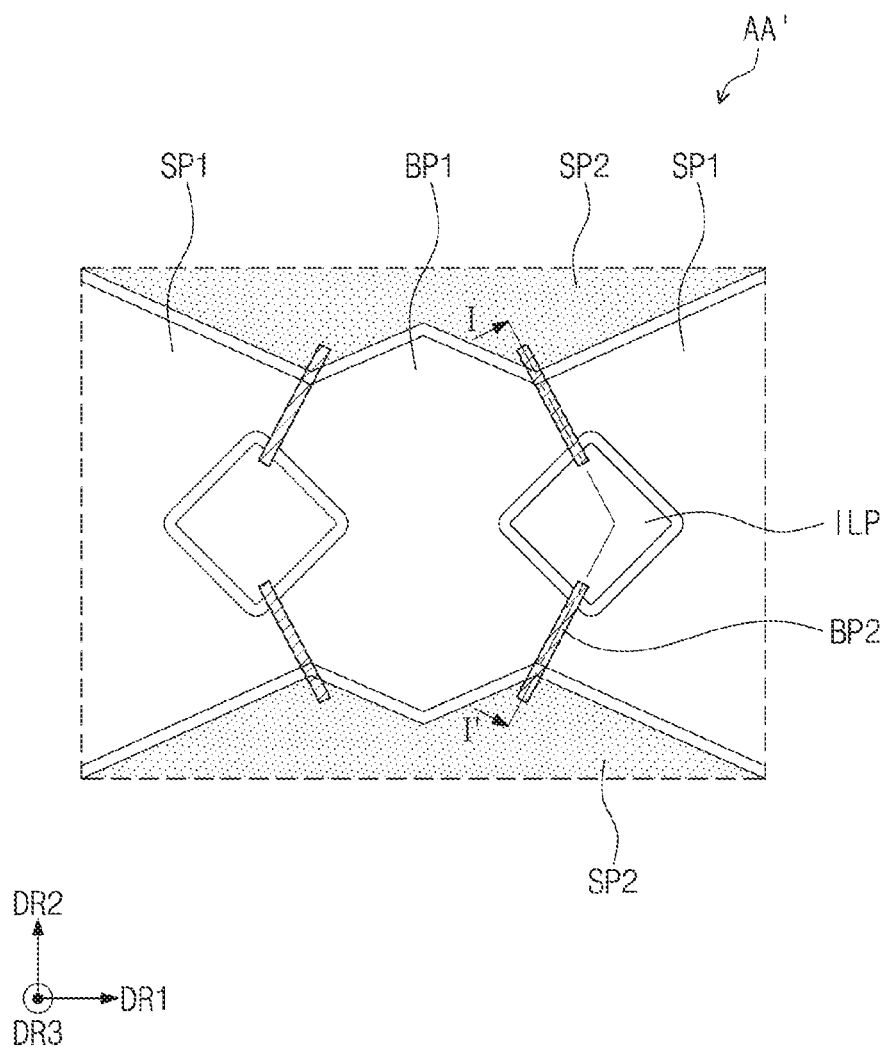
FIG. 6 is an enlarged plan view of AA' region illustrated in FIG. 5.
Figure 7:
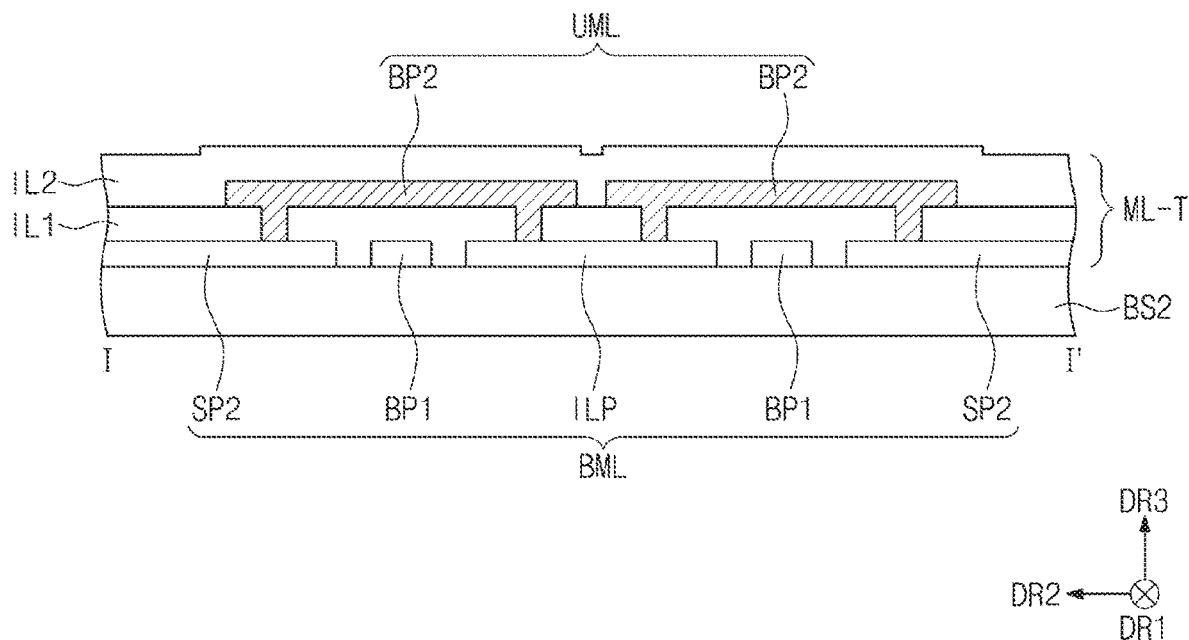
FIG. 7 is a cross-sectional view cut along line I-I' illustrated in FIG. 6.

FIG. 6 is an enlarged plan view of AA' region illustrated in FIG. 5. FIG. 7 is a cross-sectional view cut along line I-I' illustrated in FIG. 6.

In relation to FIGS. 6 and 7, the sensing circuit layer ML-T may be disposed on the second substrate BS2. The sensing circuit layer ML-T may include a first conductive layer BML, a first insulation layer IL1 disposed on the first conductive layer BML, a second conductive layer UML disposed on the first insulation layer ILL and a second insulation layer IL2 disposed on the second conductive layer UML.

The first conductive layer BML may include a transparent conductive material. In the specification, being transparent means that the transmissivity of light is a prescribed criterion or higher. For example, the prescribed criterion may be 90%, but the exemplary embodiments of the invention are not limited thereto. The first conductive layer BML may include a transparent conductive oxide, for example, at least any one among indium tin oxide (ITO), indium zinc oxide (IZO), indium gallium oxide (IGO), indium gallium zinc oxide (IGZO), or a mixture/compound thereof. However, the exemplary embodiments of the invention are not limited thereto.

The first conductive layer BML may include the first sensing patterns SP1, the first connection patterns BP1, and the second sensing patterns SP2. In addition, the first conductive layer BML may further include a dummy pattern ILP. The dummy pattern ILP may be insulated from the first sensing patterns SP1 and the first connection patterns BP1, and may be electrically connected to the second sensing patterns SP2.

The first insulation layer IL1 may cover the first conductive layer BML. The first insulation layer IL1 may include an inorganic material. The inorganic material may include at least any one among silicon oxide, silicon nitride, silicon oxy nitride, titanium oxide, or aluminum oxide.

The second conductive layer UML may include a non-transparent conductive material. For example, the second conductive layer UML may include a metal material, for example, molybdenum, silver, titanium, copper, aluminum, or an alloy thereof. The alloy may be, for example, molybdenum-niobium.

The second conductive layer UML may include the second connection patterns BP2. In an exemplary embodiment of the invention, the 4 second connection patterns BP2 are disposed to connect two second sensing patterns SP2, but the exemplary embodiments of the invention are not limited thereto. Each of the second connection patterns BP2 may be connected to one second sensing pattern SP2 and one dummy pattern ILP. The two second sensing patterns SP2, which are separated from each other, may be electrically connected through the second connection patterns BP2 and the dummy pattern ILP.

The second insulation layer IL2 may cover the second conductive layer UML. The second insulation layer IL2 may include an inorganic material, for example, at least one among silicon oxide, silicon nitride, silicon oxy nitride, titanium oxide, or aluminum oxide.

Figure 8:
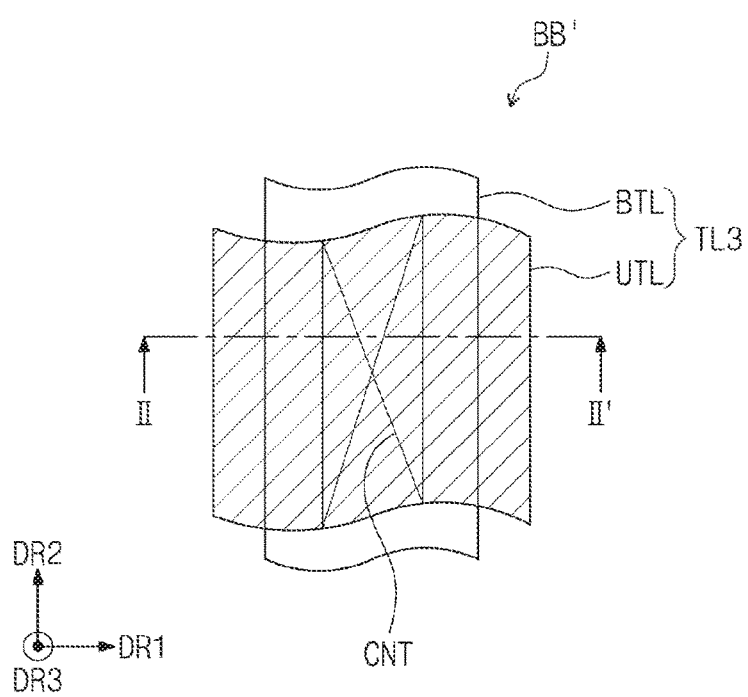
FIG. 8 is an enlarged plan view of BB' region illustrated in FIG. 5.
Figure 9:
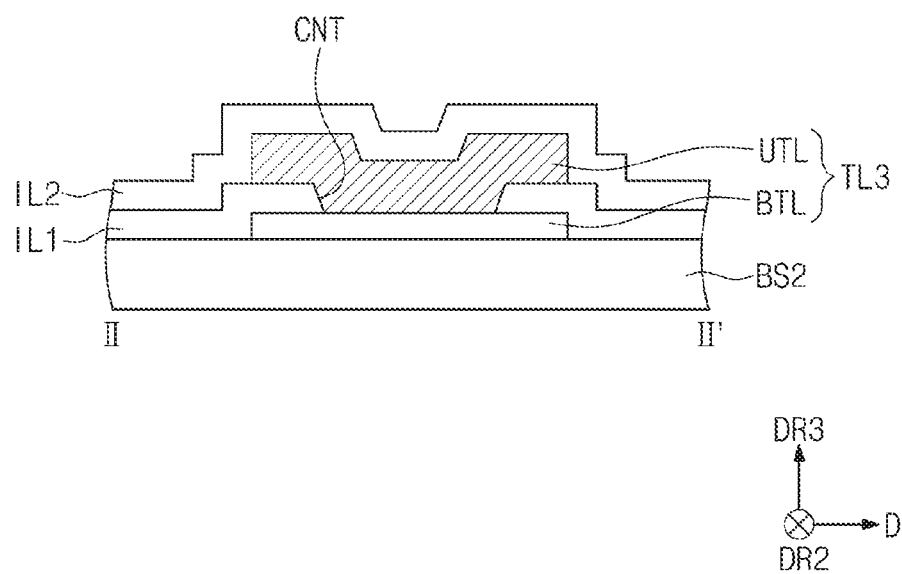
FIG. 9 is a cross-sectional view cut along line II-IF illustrated in FIG. 8.

FIG. 8 is an enlarged plan view of BB' region illustrated in FIG. 5. FIG. 9 is a cross-sectional view cut along line II-IF illustrated in FIG. 8.

In relation to FIGS. 8 and 9, the third sensing wiring TL3 is enlarged and illustrated. The first sensing wiring TL1 and the second sensing wiring TL2 illustrated in FIG. 5 may have the substantially same structure as the third sensing wiring TL3, and thus descriptions about the first sensing wiring TL1 and the second sensing wiring TL2 will be omitted to avoid redundancy.

The third sensing wiring TL3 may include a transparent conductive wiring BTL and a metal wiring UTL. The transparent conductive wiring BTL may be disposed on the second substrate BS2. The metal wiring UTL may be disposed on the transparent conductive wiring BTL. The first insulation layer IL1 may be disposed between the transparent conductive wiring BTL and the metal wiring UTL. A contact hole CNT is provided in the first insulation layer IL1, and the metal wiring UTL may penetrate through the contact hole CNT to be electrically connected to the transparent conductive wiring BTL.

The second insulation layer IL2 may be disposed on the metal wiring UTL to cover the metal wiring UTL.

According to an exemplary embodiment of the invention, the third sensing wiring TL3 may include two conductive layers, the transparent conductive wiring BTL and the metal wiring UTL. Accordingly, a defect in which the third sensing wiring TL3 is broken may be reduced. For example, when the third sensing wiring TL3 includes only the metal wiring UTL, the third sensing wiring TL3 may be broken due to corrosion or oxidation of the metal wiring UTL. In addition, the corrosion or oxidation is a progressive fault, and thus may not be detected in an inspection operation. According to an exemplary embodiment of the invention, although the metal wiring UTL is corroded or oxidized, a defect in which the third sensing wiring TL3 is broken may be minimized because the transparent conductive wiring BTL, which has high durability against corrosion or oxidation, is disposed under the metal wiring UTL.

In addition, the thickness of the transparent conductive wiring BTL may be thinner than that of the metal wiring UTL. For example, the thickness of the metal wiring UTL is several thousand angstroms, and the thickness of the transparent conductive wiring BTL may be several hundred angstroms. In addition, the metal wiring UTL may have higher flexibility than the transparent conductive wiring BTL.

According to an exemplary embodiment of the invention, the thinner and less flexible transparent conductive wiring BTL may be disposed under the metal wiring UTL. Accordingly, the difference in the upper surface of the first insulation layer IL1 configured to cover the transparent conductive wiring BTL may be reduced. In addition, since the flexibility of the metal wiring UTL is greater than that of the transparent conductive wiring BTL, the probability of the metal wiring UTL being broken by the upper surface difference of the first insulation layer IL1 may also be reduced.

Figure 10:
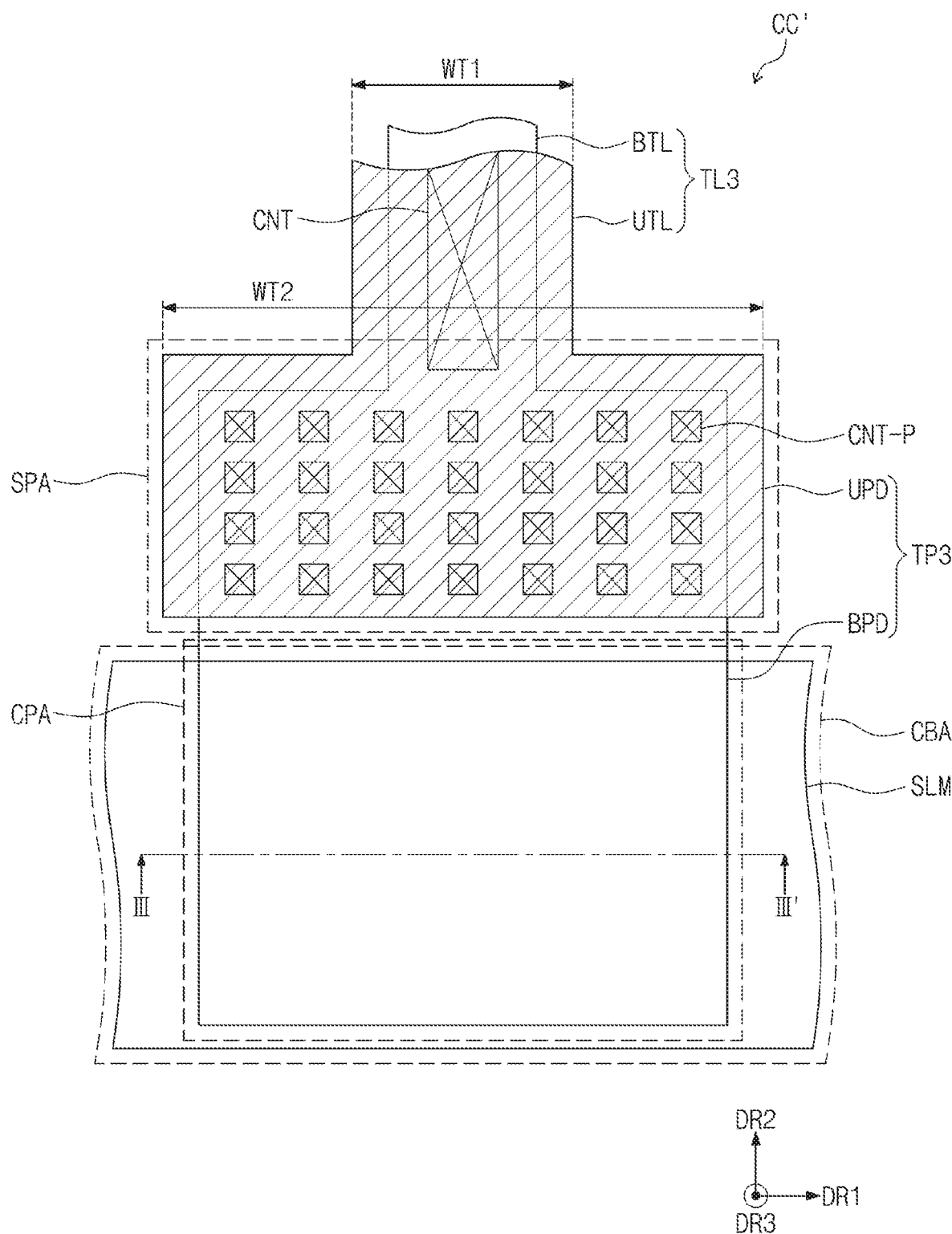
FIG. 10 is an enlarged plan view of CC' region illustrated in FIG. 5.
Figure 11:
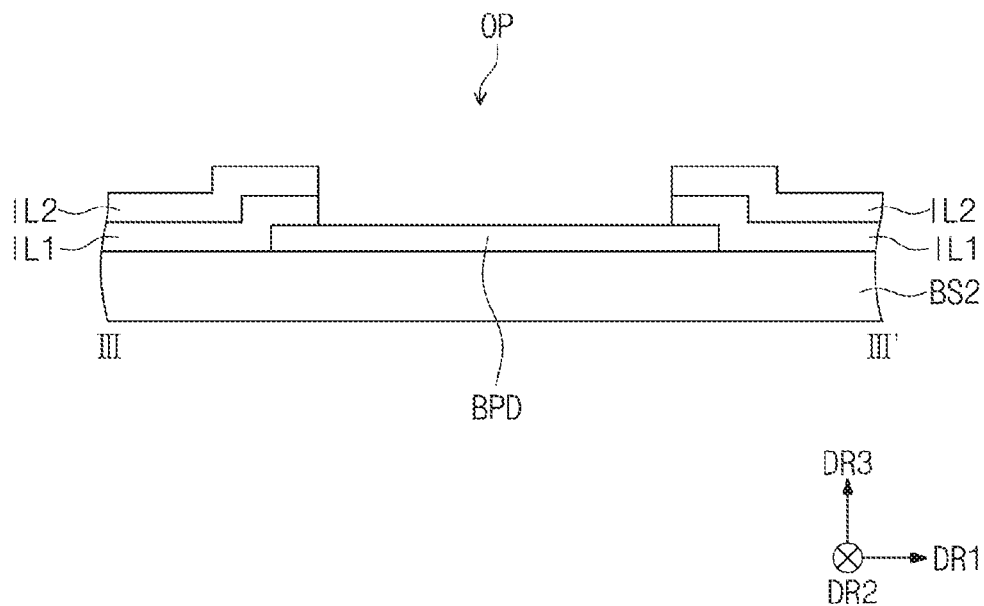
FIG. 11 is a cross-sectional view cut along line illustrated in FIG. 10.

FIG. 10 is an enlarged plan view of CC' region illustrated in FIG. 5. FIG. 11 is a cross-sectional view cut along line illustrated in FIG. 10.

In relation to FIGS. 10 and 11, the third sensing pad TP3 is enlarged and illustrated. Since the first sensing pad TP1 and the second sensing pad TP2 illustrated in FIG. 5 may have the substantially same structure as the third sensing pad TP3, descriptions of the first sensing pad TP1 and the second sensing pad TP2 will be omitted to avoid redundancy.

FIG. 10 illustrates the coupling member SLM and a coupling region CBA in which the coupling member SLM is disposed. The third sensing pad TP3 may include a coupling pad region CPA overlapping the coupling region CBA and a surrounding pad region SPA that does not overlap the coupling region CBA. When viewed in plan, the surrounding pad region SPA may be defined between the coupling pad region CPA and the metal wiring UTL.

The third sensing pad TP3 may include a transparent conductive pad BPD and a metal pad UPD. The metal pad UPD may overlap the surrounding pad region SPA and but not overlap the coupling pad region CPA. The transparent conductive pad BPD may overlap both the surrounding pad region SPA and the coupling pad region CPA. Accordingly, when viewed inplan, the area of the transparent conductive pad BPD may be larger than that of the metal pad UPD.

The transparent conductive pad BPD may include a material identical to that of the transparent conductive wiring BTL, and be disposed on the same layer. The transparent conductive pad BPD and the transparent conductive wiring BTL may have an integrated shape.

The metal pad UPD may include a material identical to that of the metal wiring UTL and be disposed on the same layer. The metal pad UPD and the metal wiring UTL may have an integrated shape. In other words, the metal wiring UTL may extend only to a region adjacent to the coupling region CBA and not extend into the coupling region CBA.

According to an exemplary embodiment of the invention, in a region that does not overlap the coupling member SLM, a non-transparent wiring may not be disposed. In other words, only a transparent conductive pad BPD may overlap the coupling region CBA. Accordingly, when light is irradiated to cure the coupling member SLM, the difference between the intensity of light provided to the coupling member SLM under the sensing pads TP1, TP2, and TP3 and the intensity of light provided to the coupling member SLM under a region in which the sensing pads TP1, TP2, and TP3 are not disposed may be minimized. Accordingly, a phenomenon in which the coupling member SLM is detached in a region overlapped with the sensing pads TP1, TP2, and TP3 may be reduced or prevented, and the durability of the display device EA (see FIG. 1) may be improved.

According to an exemplary embodiment of the invention, at least a part of the third sensing pad TP3 includes a non-transparent metal pad UPD. The non-transparent metal may be easily visually recognized or sensed. For example, when the second circuit board CF2 (see FIG. 2) is connected to the third sensing pad TP3, the position of the third pad TP3 may be easily sensed by means of the non-transparent metal pad UPD. Accordingly, it may be easier to arrange the second circuit board CF2 with the third sensing pad TP3.

The first insulation layer IL1 may be disposed between the transparent conductive pad BPD and the metal pad UPD. A plurality of contact holes CNT-P may be provided to the first insulation layer IL1. The metal pad UPD may penetrate through the plurality of contact holes CNT-P to be easily connected to the transparent conductive pad BPD.

An opening OP may be provided in a part of the first insulation layer IL1 and the second insulation layer IL2. The opening OP may expose the third sensing pad TP3. An anisotropic conductive film is disposed on the exposed third sensing pad TP3, and the third sensing pad TP3 and the second circuit board CF2 (see FIG. 2) may be electrically connected through the anisotropic conductive film.

Only the transparent conductive pad BPD may be disposed in the coupling pad region CPA, and the first insulation layer IL1 and the second insulation layer IL2 may cover at least a part of the transparent conductive pad BPD. For example, the first insulation layer IL1 and the second insulation layer IL2 may cover an outer part of the transparent conductive pad BPD.

Figure 12:
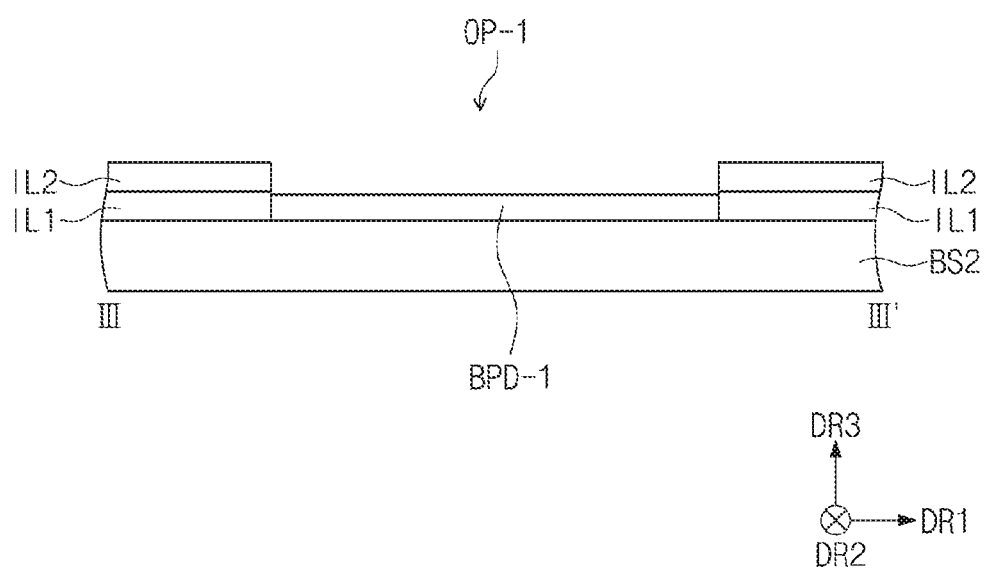
FIG. 12 is a cross-sectional view cut along a region corresponding to illustrated in FIG. 10.

FIG. 12 is a cross-sectional view cut along a region corresponding to illustrated in FIG. 10.

In relation to FIG. 12, an opening OP-1 is provided in the first insulation layer IL1 and the second insulation layer IL2, and the opening OP-1 may completely expose the transparent conductive pad BPD-1.

When the area of the transparent conductive pad BPD of FIG. 11 is assumed to be the same as that of the transparent conductive pad BPD-1, the area of the transparent conductive pad BPD-1 exposed by the opening OP-1 may be larger than that of a part of the transparent conductive pad BPD exposed by the opening OP (see FIG. 11). Accordingly, connection stability of the second circuit board CF2 (see FIG. 2) and the transparent conductive pad BPD-1 may be further improved.

In addition, when the area of a part of the transparent conductive pad BPD (see FIG. 11) exposed by the opening OP (see FIG. 11) is assumed to be the same as that of the transparent conductive pad BPD-1 exposed by the opening OP-1, the area of the transparent conductive pad BPD-1 may be designed to be smaller than that of the transparent conductive pad BPD. Accordingly, the width of the non-active region NAA-I (see FIG. 5) may be further reduced.

Figure 13:
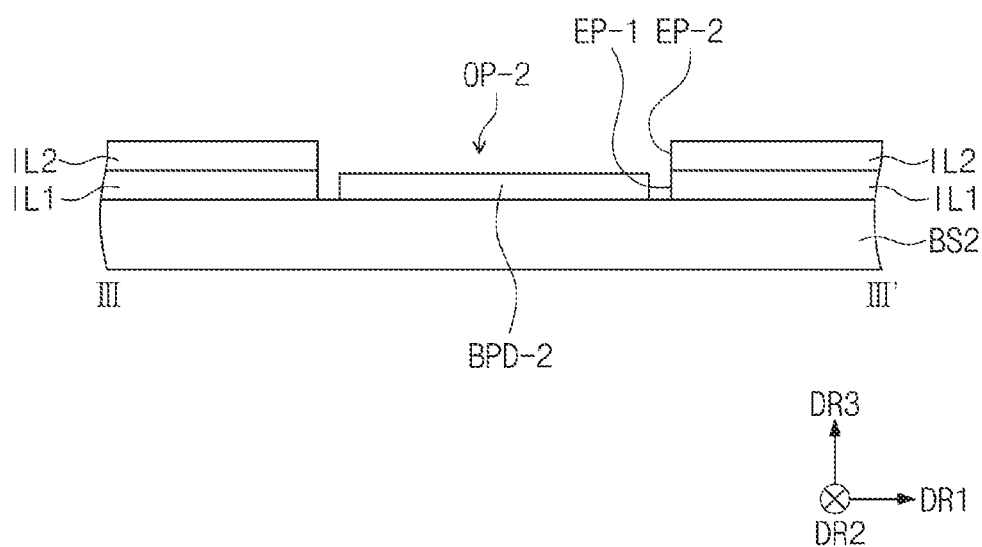
FIG. 13 is a cross-sectional view cut along a region corresponding to shown in FIG. 10.

FIG. 13 is a cross-sectional view cut along a region corresponding to shown in FIG. 10.

In relation to FIG. 13, an opening OP-2 is provided to the first insulation layer IL1 and the second insulation layer IL2, and the opening OP-2 may completely expose the transparent conductive pad BPD-2.

Ends EP-1 of the first insulation layer IL1 and ends EP-2 of the second insulation layer IL2 may be separated from the transparent conductive pad BPD-2. Accordingly, even when a fabrication error occurs, in the likelihood of the transparent conductive pad BPD-2 being covered by the first insulation layer IL1 and the second insulation layer IL2 may be reduced. In other words, the likelihood of the area of the transparent conductive pad BPD-2 exposed by the opening OP-2 being covered with insulation material may be reduced.

Figure 14:
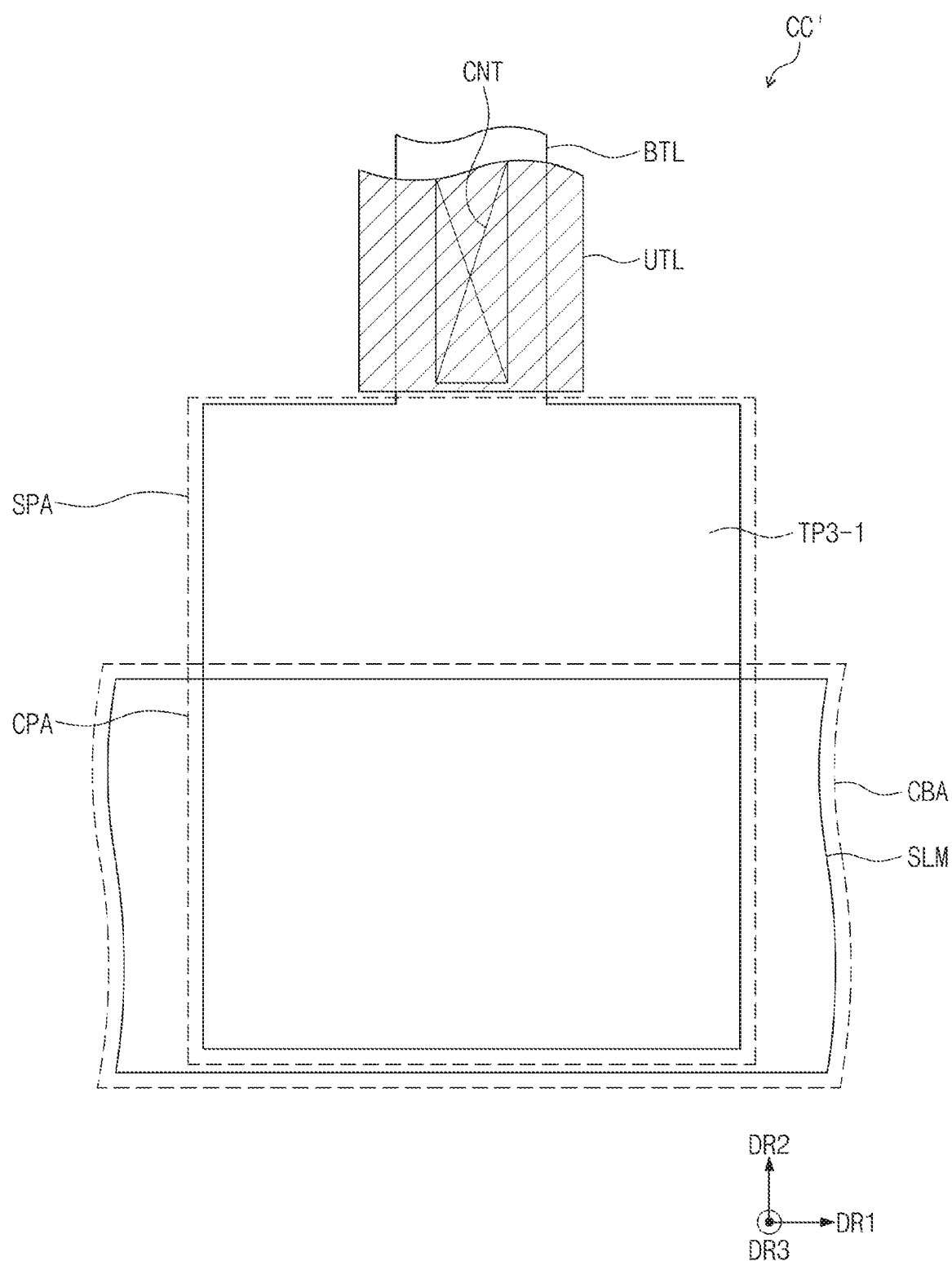
FIG. 14 is an enlarged plan view of a region corresponding to CC' region illustrated in FIG. 5.

FIG. 14 is an enlarged plan view of a region corresponding to CC' region illustrated in FIG. 5.

In relation to FIG. 14, the third sensing pad TP3-1 may include only a transparent conductive pad. Accordingly, the third sensing pad TP3-1 may not include a non-transparent metal material in the coupling pad region CPA and the surrounding pad region SPA. The metal wiring UTL may be extended only to a region adjacent to the surrounding pad region SPA.

Figure 15:
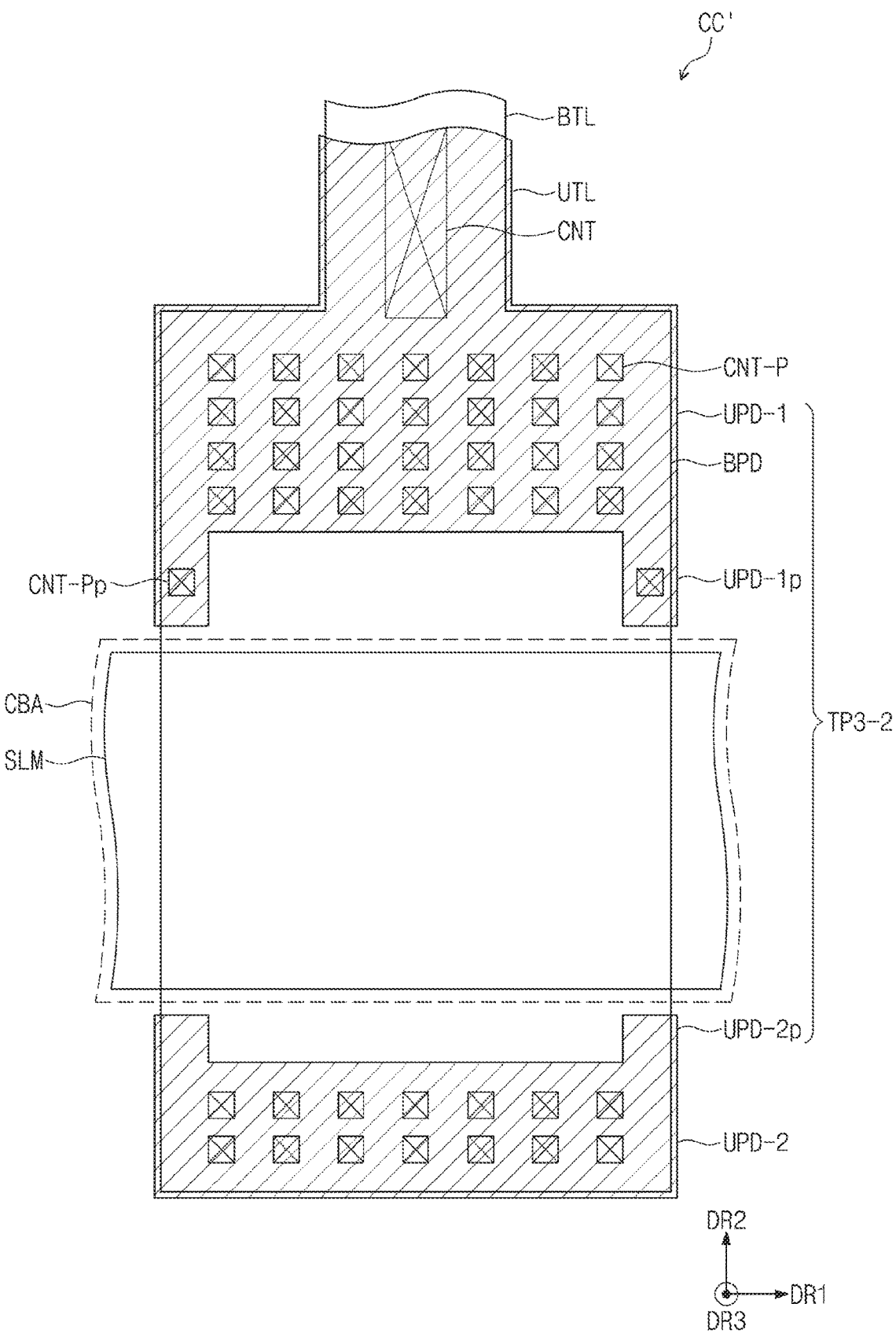
FIG. 15 is an enlarged plan view of a region corresponding to CC' region illustrated in FIG. 5.

FIG. 15 is an enlarged plan view of a region corresponding to CC' region illustrated in FIG. 5. FIG. 15 illustrates the coupling member SML and a coupling region CBA in which the coupling member SML is disposed.

In relation to FIG. 15, the third sensing pad TP3-2 may include the transparent conductive pad BPD, the first metal pad UPD-1, and the second metal pad UPD-2.

The first metal pad UPD-1 and the second metal pad UPD-2 are disposed on the transparent conductive pad BPD, and may penetrate through the plurality of contact holes CNT-P to be electrically connected to the transparent conductive pad BPD.

When viewed in plan, the first metal pad UPD-1 and the second metal pad UPD-2 may not overlap the coupling region CBA. For example, the first metal pad UPD-1 and the second metal pad UPD-2 may be separated from each other with the coupling region CBA therebetween. In a process for curing the coupling member SLM, a phenomenon in which light provided to the coupling member SLM is blocked by the first metal pad UPD-1 and the second metal pad UPD-2 may be reduced or prevented.

The third sensing pad TP3-2 may further include a first metal protrusion pad UPD-1$p$ and a second metal protrusion pad UPD-2$p$. The first metal protrusion pad UPD-1$p$ may protrude towards the coupling region CBA from the first metal pad UPD-1. The second metal protrusion pad UPD-2$p$ may protrude towards the coupling region CBA from the second metal pad UPD-2. The first metal protrusion pad UPD-1$p$ and the second metal protrusion pad UPD-2$p$ may not overlap the coupling region CBA.

The first metal protrusion pad UPD-1$p$ and the second metal protrusion pad UPD-2$p$ are disposed on the transparent conductive pad BPD, and may penetrate through the plurality of contact holes CNT-P to be electrically connected to the transparent conductive pad BPD. In an exemplary embodiment of the invention, the plurality of contact holes CNT-Pp may be omitted, and in an exemplary embodiment of the invention, the first metal protrusion pad UPD-1$p$ and the second metal protrusion pad UPD-2$p$ may also be omitted.

According to the exemplary embodiments of the invention, each of the sensing wirings includes a transparent conductive wiring BTL and a metal wiring UTL. Accordingly, even when the metal wiring UTL is corroded or oxidized, a possibility that the sensing wirings are broken may be reduced by the transparent conductive wiring BTL that has strong durability against corrosion or oxidation. In addition, only a transparent conductive pad may be disposed in a region overlapped with each coupling member SLM of sensing pads. Accordingly, in a process of curing the coupling member, a phenomenon in which light provided to the coupling members SLM is blocked by the sensing pads may be reduced prevented.

Some of the advantages that may be achieved by exemplary implementations/embodiments of the invention include improving overall durability of the sensing wiring due to the double sensing wiring structure, and improving overall durability of the coupling member area due to only the transparent conductive pad overlapping the coupling member.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display panel including a first substrate, a display circuit layer disposed on the first substrate, and an image implementation layer disposed on the display circuit layer;
an input sensing panel including a second substrate disposed on the display panel, sensing electrodes disposed on the second substrate to sense an external input, sensing wirings electrically connected with the sensing electrodes, and sensing pads electrically connected to the sensing wirings; and
a coupling member to connect the first substrate and the second substrate,
wherein:
at least some of the sensing wirings comprise a transparent conductive wiring disposed on the second substrate, and a metal wiring disposed on the transparent conductive wiring and electrically connected to the transparent conductive wiring,
at least some of the sensing pads comprise a transparent conductive pad disposed on the second substrate and connected to the transparent conductive wiring, and
the metal wiring is extended to a region adjacent to a coupling region in which the coupling member is disposed.

2. The display device of claim 1, wherein the metal wiring does not overlap the coupling region.

3. The display device of claim 1, wherein at least some of the sensing pads are defined by a coupling pad region overlapping the coupling region and a surrounding pad region which does not overlap the coupling region, the surrounding pad region being defined between the coupling pad region and the metal wiring.

4. The display device of claim 3, wherein the at least some sensing pads further comprise a metal pad disposed on the transparent conductive pad and extending from the metal wiring, and wherein the metal pad overlaps the surrounding pad region and does not overlap the coupling pad region.

5. The display device of claim 4, wherein the input sensing panel further comprises an insulation layer disposed between the transparent conductive pad and the metal pad, the transparent conductive pad and the metal pad being electrically connected to each other through at least one contact hole defined in the insulation layer, and the at least one contact hole being defined in a region overlapping the surrounding pad region.

6. The display device of claim 4, wherein the transparent conductive pad has a first surface area and the metal pad has a second surface area smaller than the first surface area.

7. The display device of claim 3, wherein the input sensing panel further comprises a first insulation layer disposed between a portion of the transparent conductive wiring and a portion of the metal wiring, and a second insulation layer disposed on the first insulation layer and covering the metal wiring.

8. The display device of claim 7, wherein the first insulation layer and the second insulation layer cover at least a part of the transparent conductive pad.

9. The display device of claim 7, wherein an opening is defined in the first insulation layer and the second insulation layer, and the opening completely exposes the transparent conductive pad.

10. The display device of claim 9, wherein an end of the first insulation layer and an end of the second insulation layer are separated from the transparent conductive pad.

11. The display device of claim 1, wherein at least some of the sensing pads further comprise a first metal pad disposed on the transparent conductive pad and a second metal pad disposed on the transparent conductive pad, the first metal pad extending from the metal wiring, and the second metal pad being separated from the first metal pad with the coupling region disposed therebetween.

12. The display device of claim 1, wherein each of the at least some sensing wirings has a first width and each of the at least some sensing pads has a second width larger than the first width.

13. The display device of claim 1, wherein the sensing electrodes comprise a first sensing electrode including first sensing patterns and first connection patterns, and a second sensing electrode including second sensing patterns and second connection patterns, and the first sensing patterns, the second sensing patterns, and the first connection patterns are disposed on the second substrate, and the second connection patterns are insulated from the first connection patterns and the first sensing patterns and disposed on the first connection patterns.

14. The display device of claim 13, wherein the first sensing patterns, the second sensing patterns, and the first connection patterns comprise a material the same as a material of the transparent conductive wiring and the transparent conductive pad, and the second connection patterns comprise a material to the same as a material of the metal wiring.

15. The display device of claim 1, wherein the coupling member surrounds the sensing electrodes and the sensing wirings, and overlaps at least a part of each of the at least some sensing pads.

16. A display device comprising:
a first substrate;
a second substrate disposed on the first substrate, and having an active region and a non-active region surrounding the active;
a coupling member disposed between the first substrate and the second substrate to couple the first substrate and the second substrate;
sensing electrodes disposed on the active region of the second substrate;
sensing wirings disposed on the non-active region of the second substrate and electrically connected to the sensing electrodes, wherein at least some of the sensing electrodes comprise a transparent conductive wiring and a metal wiring disposed on the transparent conductive wiring; and
sensing pads disposed on the non-active region of the second substrate, wherein at least some of the sensing pads comprise a transparent conductive pad extending from the transparent conductive wiring and disposed on the same layer as the transparent conductive wiring,
wherein the coupling member overlaps the sensing pads.

17. The display device of claim 16, wherein the coupling member overlaps the non-active region, and does not overlap the sensing wirings.

18. The display device of claim 16, wherein the transparent conductive wiring comprises indium tin oxide, and the metal wiring comprises molybdenum.

19. The display device of claim 16, wherein each of the at least some sensing pads further comprises a metal pad disposed on the transparent conductive pad extending from the metal wiring, and, the metal pad does not overlap the coupling member.

20. The display device of claim 19, wherein the transparent conductive pad has a first surface area and the metal pad has a second surface area smaller than the first surface area.

* * * * *